(12) United States Patent
Zou

(10) Patent No.: US 10,916,734 B2
(45) Date of Patent: Feb. 9, 2021

(54) METHOD OF MANUFACTURING CURVED DISPLAY, CURVED DISPLAY AND DISPLAY

(71) Applicant: Wuhan China Star Optoelectronics Semiconductor Display Technology Co., Ltd., Hubei (CN)

(72) Inventor: Xin Zou, Guangdong (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 120 days.

(21) Appl. No.: 16/108,835

(22) Filed: Aug. 22, 2018

(65) Prior Publication Data

US 2019/0245164 A1  Aug. 8, 2019

Related U.S. Application Data

(63) Continuation of application No. PCT/CN2018/079562, filed on Mar. 20, 2018.

(30) Foreign Application Priority Data

Feb. 7, 2018 (CN) .......................... 2018 1 0125459

(51) Int. Cl.
*H01L 51/56* (2006.01)
*H01L 27/32* (2006.01)
(Continued)

(52) U.S. Cl.
CPC .............. *H01L 51/56* (2013.01); *G09F 9/301* (2013.01); *G09G 3/3225* (2013.01); *H01L 27/3211* (2013.01); *H01L 27/3244* (2013.01); *H01L 51/003* (2013.01); *H01L 51/0097* (2013.01); *G09G 2300/0439* (2013.01); *H01L 2251/5338* (2013.01)

(58) Field of Classification Search
CPC ... H01L 51/56; H01L 51/003; H01L 51/0097; H01L 27/3244; H01L 27/3211; H01L 2251/5338; G09G 3/3225; G09G 2300/0439; G09F 9/301
See application file for complete search history.

(56) References Cited

U.S. PATENT DOCUMENTS

2006/0098153 A1  5/2006  Slikkerveer et al.
2014/0045283 A1  2/2014  Hirakata et al.
(Continued)

FOREIGN PATENT DOCUMENTS

CN  103713436 A  4/2014
CN  104992632 A  10/2015

*Primary Examiner* — Ahmed N Sefer

(57) ABSTRACT

The disclosure discloses a method of manufacturing a curved display, a curved display and a display. The method for manufacturing a curved display includes: acquiring a flat display including a to be bent portion; performing a shrink treatment on the to be bent portion of the flat display; bending the to be bent portion of the flat display after the shrink treatment, to form the curved display. The present disclosure performs a shrink treatment on the to be bent portion before bending the display, and then the display is bent so that it can avoid uneven display of the bent portion and reduce the surface strength of the bent portion, the display effect of the display can be maintained, and the life of the display can be improved.

9 Claims, 4 Drawing Sheets

(51) Int. Cl.
*H01L 51/00* (2006.01)
*G09F 9/30* (2006.01)
*G09G 3/3225* (2016.01)

(56) References Cited

U.S. PATENT DOCUMENTS

| | | | |
|---|---|---|---|
| 2015/0102296 A1* | 4/2015 | Kim | H01L 51/5253 257/40 |
| 2015/0227172 A1* | 8/2015 | Namkung | H01L 27/3267 345/173 |
| 2016/0187930 A1* | 6/2016 | Jinbo | G06F 1/3265 313/511 |
| 2016/0240604 A1 | 8/2016 | Kim | |
| 2016/0338219 A1* | 11/2016 | Seo | G06F 1/1652 |
| 2017/0155087 A1 | 6/2017 | Lee et al. | |
| 2018/0145278 A1* | 5/2018 | Zhai | H01L 23/4985 |
| 2019/0011954 A1* | 1/2019 | Chu | B32B 7/12 |
| 2019/0064574 A1 | 2/2019 | Chen | |
| 2019/0269011 A1* | 8/2019 | Lee | H05K 3/0014 |
| 2019/0346883 A1* | 11/2019 | Kim | H04M 1/0216 |

\* cited by examiner

METHOD OF MANUFACTURING CURVED DISPLAY, CURVED DISPLAY AND DISPLAY

CROSS-REFERENCE TO RELATED APPLICATIONS

The present application is a continuation-application of International (PCT) Patent Application No. PCT/CN2018/079562, filed on Mar. 20, 2018, which claims foreign priority of Chinese Patent Application No. 201810125459.2, filed on Feb. 7, 2018 in the State Intellectual Property Office of China, the entire contents of which are hereby incorporated by reference.

TECHNICAL FIELD

The present disclosure generally relates to display technology, and in particular to a method of manufacturing a curved display, a curved display and a display.

BACKGROUND

Organic light-emitting display technology gradually replaces liquid crystal displays due to its advantages of wide viewing angle, high contrast, wide color gamut, fast response speed etc. since its birth. In recent years, flexible organic light-emitting diode (OLED) display technology is developed rapidly, and in various regions, flexible mass production project have been continuously put into production. Compared with conventional glass rigid displays, flexible displays have impact resistance, strong shock resistance lightweight, small size, and wearable and other advantages.

Flexible displays widely use thin film type flexible display substrate at present, the substrate has good bending characteristics, can achieve borderless display, and are the most possible way to achieve wearable display at present.

However, when the current display achieve the curved surface display, the flat display needs to be bent, the surface of the display will be stretched at the bent position, the grainy sensation of the bent portion is highlighted, and the display effect is uneven; on the other hand, the surface strength of the stretched portion decreases, affecting the life of the display.

Therefore, it is necessary to provide an improved method of manufacturing a curved display.

SUMMARY

The technical problem mainly solved by the present disclosure is to provide a method of manufacturing a curved display, a curved display and a display, which can avoid uneven display of a bent portion and reduce the surface strength of the bent portion.

In order to solve the technical problem mentioned above, one technical solution adopted by the present disclosure is: providing a method of manufacturing a curved display, including: acquiring a flat display comprising a to be bent portion; performing a shrink treatment on the to be bent portion of the flat display; bending the to be bent portion of the flat display after the shrink treatment, to form the curved display.

In order to solve the technical problem mentioned above, another technical solution adopted by the present disclosure is: providing a curved display, including:
a base film layer comprising a bent portion;
pixels disposing on one surface of the base film layer, and the pixels are substantially equidistantly disposed on;
an elastic film layer disposing on the other surface of the base film layer, and the elastic film layer is disposed on the bent portion of the base film layer.

In order to solve the technical problem mentioned above, another technical solution adopted by the present disclosure is: providing a display, including:
a base film layer comprising a bent portion;
pixels disposing on one surface of the base film layer, and the pixels are substantially equidistantly disposed on;
an elastic film layer disposing on the other surface of the base film layer, and the elastic film layer is disposed on the bent portion of the base film layer.

The benefit effects of the present disclosure are: different from the prior art, the present disclosure performs a shrink treatment on a to be bent portion before bending the display, the display is in a shrinking state, and then the display is bent so that the outer surface of the bent portion of the display has no or only slight tension. It can avoid uneven display of the bent portion and reduce the surface strength of the bent portion, the display effect of the display can be maintained, and the life of the display can be improved.

DETAILED DESCRIPTION

The technical solutions in the embodiments of the present disclosure will be clearly and completely described in connection with the drawings in the embodiments of the present disclosure. Obviously, the embodiments described here are merely parts of the present disclosure, not all parts. Based on the embodiments in the present disclosure, all other embodiments can be obtained by those skilled in the art without making any creative work are within the scope of the protection of the present disclosure.

The present embodiment provides a method of manufacturing a curved display. The method may include: acquiring a flat display comprising a to be bent portion, performing a shrinkage treatment on the to be bent portion of the flat display, and bending the to be bent portion of the flat display after the shrinking treatment, to form the curved display.

To clearly illustrate the method of manufacturing the curved display described above, please referring to FIG. 1, FIG. 1 is a flow chart of an embodiment of the method of manufacturing a curved display provided by the present disclosure.

Figure 1:
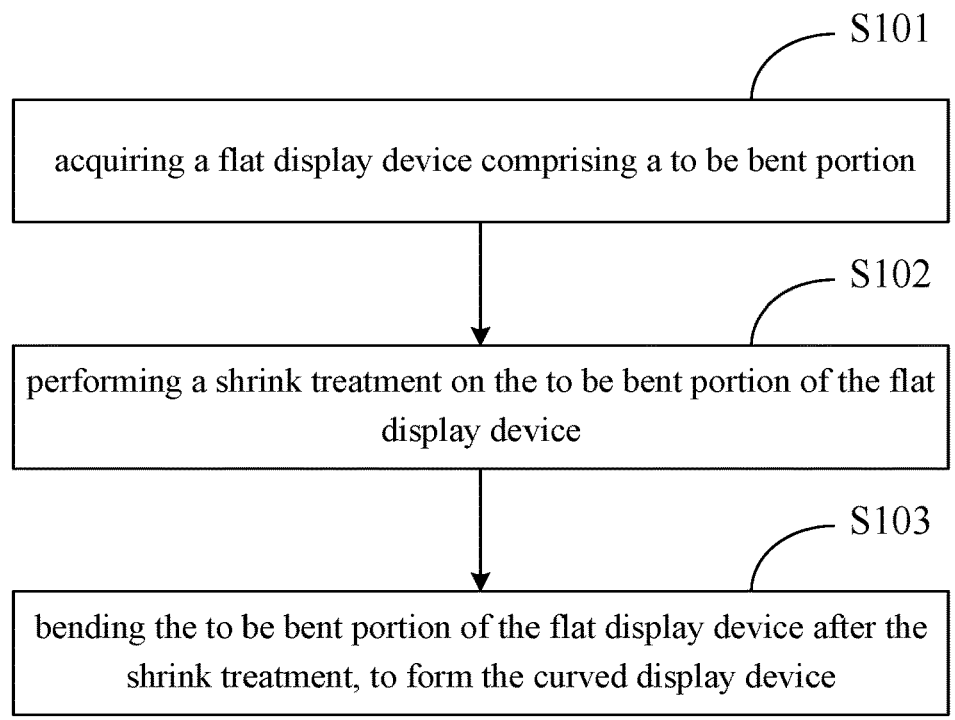
FIG. 1 is a flow chart of an embodiment of the method of manufacturing a curved display provided by the present disclosure.

As shown in FIG. 1, the method of manufacturing the curved display of the present disclosure includes following blocks:

S101: acquiring a flat display comprising a to be bent portion.

Figure 2A:
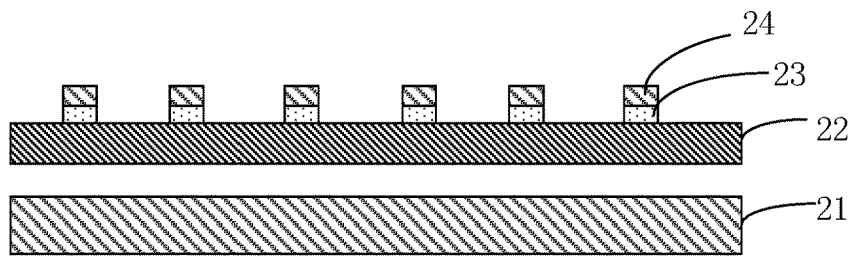
FIG. 2a is a schematic cross-sectional view diagram of the flat display and a flat glass substrate in block S101 in FIG. 1.

In a specific embodiment, further referring to FIG. 2a. FIG. 2a is a schematic cross-sectional view diagram of the flat display and a flat glass substrate in block S101 in FIG. 1. At this time, the flat display is separated from the flat glass substrate 21. The flat display includes a base film layer 22, a first film layer 23, and pixels 24. In this embodiment, the base film layer 22 is a polyimide (PI) layer, the pixels 24 are disposed on the base film layer 22 through the first layer 23, and the pixels 24 include at least one of red pixel, green pixel, blue pixel and other pixel. In other embodiments, the base film layer 22 may also be other materials, which is not limited in the present disclosure.

S102: performing a shrink treatment on the to be bent portion of the flat display.

Figure 2B:
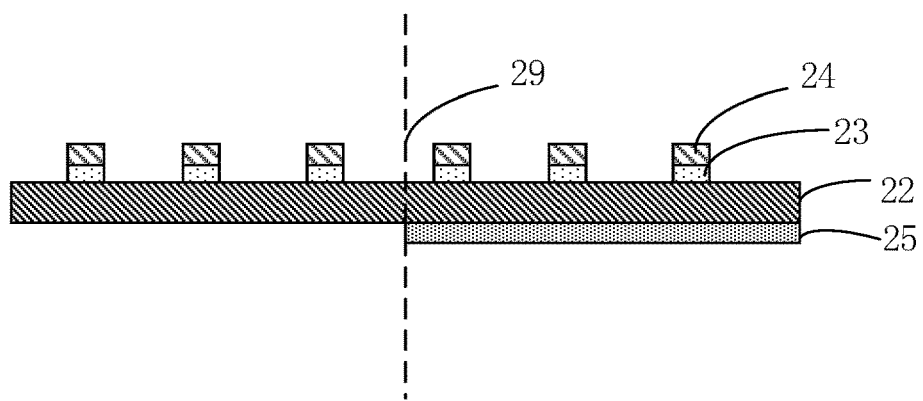
FIG. 2b is a schematic cross-sectional view diagram of the first state of the flat display in block S102 in FIG. 1.

Please refer to FIG. 2b, which is a schematic cross-sectional view diagram of the first state of the flat display in block S102 in FIG. 1. As shown in FIG. 2b, the flat display includes a base film layer 22, a first film layer 23, and pixels 24. The flat display includes a flat portion and a to be bent portion. The left portion of the boundary line 29 is the flat portion, and the right portion of the boundary line 29 is the to be bent portion. The distance between the pixels 24 on the flat portion is substantially equal to the distance between the pixels 24 on the to be bent portion. The flat display furthering includes an elastic film 25 which is in a stretchable state, at the to be bent portion of the flat display, the elastic film 25 is adhered to the base film layer 22.

In a specific embodiment, the two ends of the elastic film 25 are applied with opposite pulling forces for being stretched so that tension is generated inside the elastic film 25 to form the elastic film 25 in a stretchable state. A material of the elastic film 25 may be rubber, polyethylene (PE), polypropylene (PP), polyvinyl chloride (PVC), nylon (PA) etc., which is not limited in the present disclosure. Then, adhering the elastic film 25 in a stretchable state to the base film layer 22 of the to be bent portion of the flat display so that when releasing a stretching stress of the elastic film 25, the elastic film 25 to shrink naturally and perform the shrink treatment on the base film layer 22. Moreover, due to the characteristics of the elastic film 25, the force generated during the shrinking is uniform, so that the base film layer 22 is naturally shrunk.

In the present embodiment, the base film layer 22 is subjected to shrink treatment by the elastic film 25 in a stretchable state, and in other embodiments, the base film layer 22 may also be subjected to shrink treatment by other methods such as temperature shrinkage, physical pressure, etc. The disclosure does not limit this.

In the present embodiment, the length of the elastic film 25 after being stretched is the length of the base film layer 22 after being bent at the to be bent portion, and the stretch length of the elastic film 25 can be calculated according to a preset curvature. The preset curvature is the curvature of the to be bent portion of the base film layer 22 after being bent. In other embodiments, the stretch length may also be calculated according to other methods. The stretch length may also be determined according to a specific situation, which is not limited in the present disclosure.

In the present embodiment, the elastic film 25 in a stretchable state is adhered to the surface of the base film layer 22 where the pixels 24 are not disposed on. In other embodiments, the elastic film 25 in a stretchable state may also be adhered to other areas, which is not limited in the present disclosure.

Figure 2C:
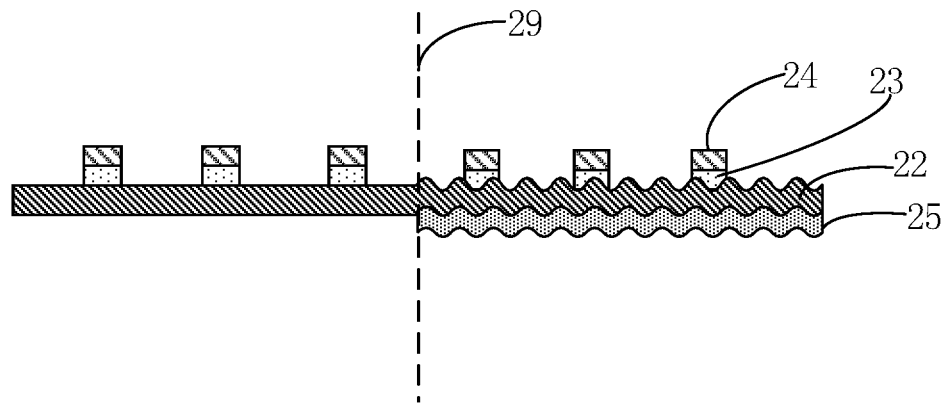
FIG. 2c is a schematic cross-sectional view diagram of the second state of the flat display in block S102 in FIG. 1.

Referring to FIG. 2c, FIG. 2c is a schematic cross-sectional view diagram of the second state of the flat display in block S102 in FIG. 1. As shown in FIG. 2c, the flat display includes a base film layer 22, a first film layer 23, and pixels 24. The flat display includes a flat portion and a to be bent portion. The left portion of the boundary line 29 is the flat portion, and the right portion of the boundary line 29 is the to be bent portion. In the flat portion of the flat display, the base film layer 22 is in a natural state. It should be noted that the natural state of the present disclosure means that the base film layer 22 neither extends nor shrinks in a direction parallel to its surface. At the to be bent portion of the flat display, the base film layer 22 is in a shrinking state, and the base film layer 22 is adhered to a elastic film 25 in a shrinking state. It should be noted that the elastic film 25 in a shrinking state only shrinks with respect to the stretched state. At this time, the distance between the pixels 24 on the flat portion is substantially greater than the distance between the pixels 24 on the to be bent portion.

Referring to FIG. 2b and FIG. 2c, in a specific embodiment, releasing a stress of the elastic film 25 in a stretchable state after adhering the elastic film 25 in the stretchable state to the base film layer 22 at the to be bent position of the flat display. The elastic film 25 shrinks naturally to perform a shrink treatment on the base film layer 22. After performing the shrink treatment, the base film layer 22 in the natural state is transformed into the base film layer 22 in the shrinking state, and the elastic film 25 in the stretchable state is transformed into the elastic film 25 in the shrinking state. Due to the shrinkage of the base film layer 22, the distance between the pixels 24 above the base film layer 22 is reduced.

Figure 2D:
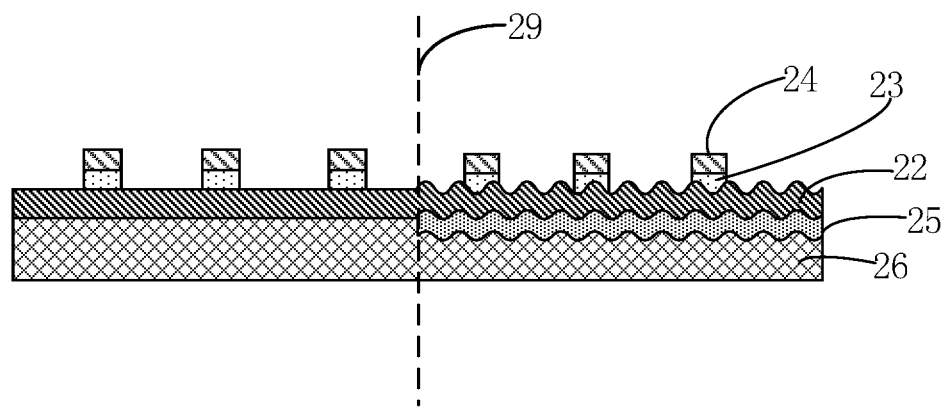
FIG. 2d is a schematic cross-sectional view diagram of the third state of the flat display in block S102 in FIG. 1.

Referring to FIG. 2d, FIG. 2d is a schematic cross-sectional view diagram of the third state of the flat display in block S102 in FIG. 1. As shown in FIG. 2d, the flat display includes a base film layer 22, a first film layer 23, pixels 24, an elastic film 25 and a limited layer 26. The flat display includes a flat portion and a to be bent portion. The left portion of the boundary line 29 is the flat portion, and the right portion of the boundary line 29 is the to be bent portion. At the flat portion of the flat display, the base film 22 is in a natural state. At the to be bent portion of the flat display, the base film layer 22 is in a shrinking state, and the base film layer 22 is adhered to the elastic film 25 in a shrinking state. It should be noted that the elastic film 25 in the shrinking state only shrinks relative to the stretchable state. The limited layer 26 is used to define the current shrinking state of the flat display to maintain the current shrinking state of the flat display.

In a specific embodiment, the limited layer 26 is adhered to the elastic film 25 in the shrinking state and the base film layer 22 of the flat portion after performing a shrink treatment on the to be bent portion of the flat display by the elastic film 25 in the stretchable state. Due to the limiting action of the limited layer 26, the elastic film 25 in the shrinking state and the base film layer 22 at the to be bent portion can maintain the shrinking state, and therefore, the shrinking flat display can be maintained in a shrinking state before bending a material of the limited layer 26 may be acrylic, phosphoenolpyruvate (PEP), polyethylene naphthalate (PEN), polyimide (PI) etc. In other embodiments, only the limited layer 26 can be adhered to the elastic film 25 in the shrinking state so that the shrinking flat display can maintain the shrinking state before being bent, which is not limited in the present disclosure.

S103: bending the to be bent portion of the flat display after the shrink treatment, to form the curved display.

Figure 2E:
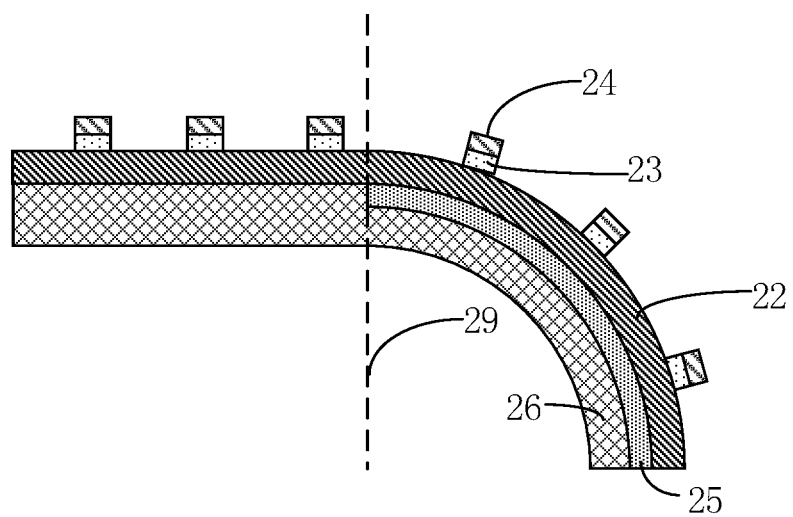
FIG. 2e is a schematic cross-sectional view diagram of the curved display in block S103 in FIG. 1.

Referring to FIG. 2e, FIG. 2e is a schematic cross-sectional view diagram of the curved display in block S103 in FIG. 1. As shown in FIG. 2e, the curved display includes a base film layer 22, a first film layer 23, pixels 24, an elastic film 25 and a limited layer 26. The curved display includes a flat portion and a bending portion. The left portion of the dividing line 29 is the flat portion, and the right portion of the dividing line 29 is the bending portion (this portion is a to be bent portion before being bent, and is a bending portion after being bent). At the flat portion of the curved display, the base film layer 22 is planar and is in a natural state. At the bent portion of the curved display, the base film layer 22 is curved and is in a natural state, and the base film layer 22 is adhered to the elastic film 25. The limited layer 26 is used to define the current bending state of the curved display. At this time, the distance between the pixels 24 on the flat portion is substantially equal to the distance between the pixels 24 on the bent portion.

In a specific embodiment, after the flat display after the shrink treatment to maintain the shrinking state before bending by the limited layer 26, the to be bent portion of the flat display is bent according to a preset curvature, so that the flat display is Turns into a curved display. The limited layer 26 shapes the base film layer 22 at the bent portion. Since the base film layer 22 at the bent portion returns to the length before the shrink treatment, the base film layer 22 at the bent portion returns to the natural state, and the distance between the pixels 24 on the base film layer 22 at the bent portion is substantially equal to the pixels 24 on the flat portion. Since the distance of the pixels on the bent portion and the flat portion are substantially equal, the display unevenness is avoided, and at the same time, since the base film layer 22 of the bent portion and the flat portion is in a natural state, the strength of the base film layer 22 is enhanced, and the lifetime of the display is improved.

Figure 3:
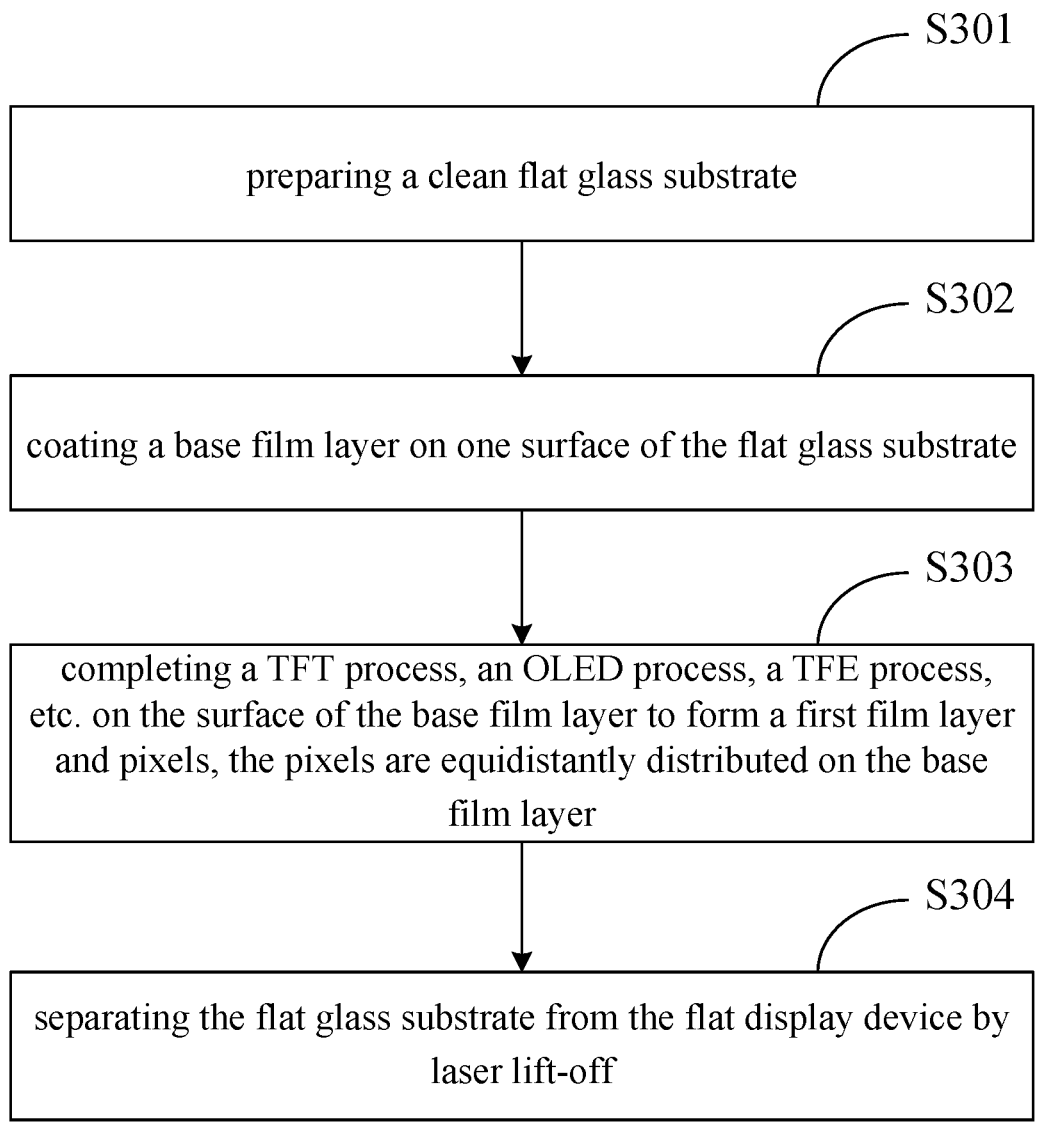
FIG. 3 is a sub-flow chart of block S101 in FIG. 1.

For the specific method of manufacturing the flat display in block S101 in FIG. 1, referring to FIG. 3. FIG. 3 is a sub-flow chart of block S101 in FIG. 1. The production process of a flat display includes:

S301: preparing a clean flat glass substrate.

S302: coating a base film layer on one surface of the flat glass substrate.

S303: completing a TFT process, an OLED process, a TFE process, etc. on the surface of the base film layer to form a first film layer and pixels, the pixels are substantially equidistantly distributed on the base film layer.

Specifically, completing the TFT process, the OLED process, the TFE process, etc. on the surface of the base film layer to form a first film layer and pixels, the pixels are disposed on the base film layer through the first layer, and the pixels are substantially equidistantly distributed on the base film layer. It should be noted that, the pixels are distributed substantially equidistantly along the surface of the base film layer laterally or longitudinally, but the relationship between the distance of the pixels distributed laterally and the distance of the pixels distributed longitudinally is not limited.

S304: separating the flat glass substrate from the flat display by laser lift-off.

In other embodiments, the flat glass substrate and the flat display can also be separated by other methods, which is not limited in the present disclosure.

It should be noted that, in the above embodiment, the curved display includes a flat portion and a to be bent portion. In other embodiments, the curved display may be a pure curved display and does not include a flat portion. Bending entirely the flat display by the above method to form the curved display.

Different from the prior art, in the method for manufacturing a curved display of the present disclosure, after performing a shrink treatment on the flat display according to a preset curvature, bending the flat display to form a curved display. On the one hand, it can ensure the distance between the pixels on the bent portion of the curved display is substantially equal to the distance between the pixels on the flat portion of the curved display, it can avoid the grainy sensation of the bent portion is highlighted, and the uniform display effect is maintained. On the other hand, the base film layer of the bent portion of the curved display is in a natural state after being bent, and it can avoid stretching the base film layer when bending the base film layer to causes a decrease in the surface strength of the stretched portion, which increases the lifetime of the display.

Figure 4:
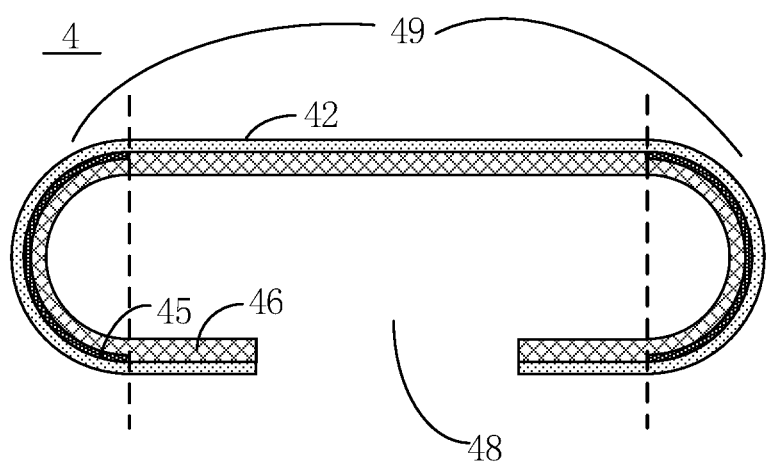
FIG. 4 is a schematic cross-sectional view diagram of an embodiment of a curved display provided by the present disclosure.

Referring to FIG. 4, FIG. 4 is a schematic cross-sectional view diagram of an embodiment of a curved display provided by the present disclosure. As shown in FIG. 4, the curved display 4 includes a flat portion 48 and a bent portion 49. The curved display includes a base film layer 42, pixels (not shown), and an elastic film layer 45. The pixels are disposed on one surface of the base film layer 42 and the elastic film layer 45 is disposed on the other side surface of the base film layer 42. The elastic film layer 45 is disposed on the bent portion 49 of the base film layer 42. The pixels are disposed on the base film layer 42 at substantially equal distance. The curved display further includes a limited layer 46. The limited layer 46 is disposed on a side of the base film layer 42 where the pixels are not disposed on, and is located on one side of the base film layer 42 together with the elastic film layer 45. The elastic film layer 45 is disposed between the limited layer 46 and the base film layer 42. In other embodiments, the thickness of the base film layer 42 may be increased so that the limited layer 46 is omitted. In this embodiment, before the bending of the base film layer 42 of the bent portion 49, the stretched length is first calculated according to a preset curvature, and stretching the elastic film 45 according to the stretched length, and then adhering the elastic film 45 after stretching to the base film layer 42 of the bending portion 49, and releasing a stretching stress of the elastic film 45 so that the base film layer 42 of the bending portion 49 is shrunk by the elastic film 45 to shrink, and the shrinking state of the layer 42 is defined by the limited layer 46, then bending the bent portion 49 according to the preset curvature, so that the base film layer 42 of the bent portion 49 is restored to the original length, and thus is in a natural state, and the distance of the pixels thereon is also restored to substantially equal to the distance of the pixels of the flat portion 48. It should be noted that the order of specific blocks may be adjusted according to actual conditions, and the preset curvature may be adjusted according to actual conditions, which is not limited in the present disclosure.

Different from the prior art, in the curved display of the present disclosure, after performing a shrink treatment on the flat display according to a preset curvature, bending the flat display to form a curved display. On the one hand, it can ensure the distance between the pixels on the bent portion of the curved display is substantially equal to the distance between the pixels on the flat portion of the curved display, it can avoid the grainy sensation of the bent portion is highlighted, and the uniform display effect is maintained. On the other hand, the base film layer of the bent portion of the curved display is in a natural state after being bent, and it can avoid stretching the base film layer when bending the base film layer to causes a decrease in the surface strength of the stretched portion, which increases the lifetime of the display.

Figure 5:
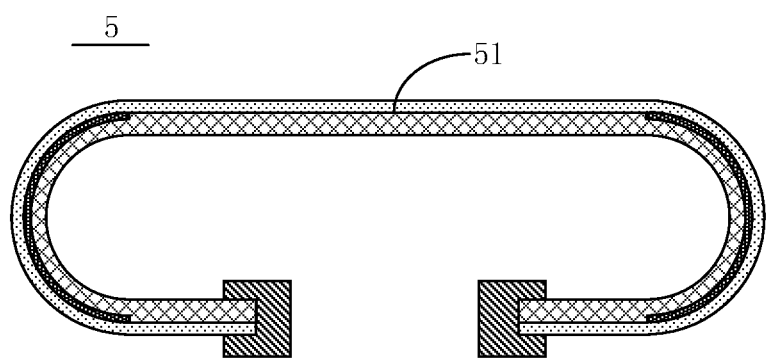
FIG. 5 is a schematic cross-sectional view diagram of an embodiment of a display provided by the present disclosure.

Referring to FIG. 5, FIG. 5 is a schematic cross-sectional view diagram of an embodiment of a display provided by the present disclosure. As shown in FIG. 5, the display 5 of the present disclosure includes a curved display 51. The curved display 51 includes any of the curved displays described above.

Different from the prior art, in the display of the present disclosure, after performing a shrink treatment on the flat display according to a preset curvature, bending the flat display to form a curved display. On the one hand, it can ensure the distance between the pixels on the bent portion of the curved display is substantially equal to the distance between the pixels on the flat portion of the curved display, it can avoid the grainy sensation of the bent portion is highlighted, and the uniform display effect is maintained. On the other hand, the base film layer of the bent portion of the curved display is in a natural state after being bent, and it can avoid stretching the base film layer when bending the base film layer to causes a decrease in the surface strength of the stretched portion, which increases the lifetime of the display.

The above description depicts merely some exemplary embodiments of the disclosure, but is meant to limit the scope of the disclosure. Any equivalent structure or flow transformations made by the description and the drawing of the present disclosure, or any direct or indirect applications of the disclosure on other related fields, shall all be covered within the protection of the disclosure.

What is claimed is:

1. A method of manufacturing a curved display, comprising:
    acquiring a flat display comprising a to be bent portion;
    performing a shrink treatment on the to be bent portion of the flat display;
    adhering a limited layer to the flat display after the shrink treatment such that the flat display after the shrink treatment remains in a shrinking state before being bent;
    bending the to be bent portion of the flat display after the shrink treatment, to form the curved display.

2. The method according to claim 1, wherein the performing the shrink treatment on the to be bent portion of the flat display comprises:
    providing an elastic film which is in a stretchable state;
    adhering the to be bent portion of the flat display to the elastic film;
    releasing a stretching stress of the elastic film to cause the elastic film to shrink naturally and perform the shrink treatment on the flat display.

3. The method according to claim 2, wherein the elastic film is made of at least one of rubber, polyethylene, polypropylene, polyvinyl chloride and nylon.

4. The method according to claim 2, wherein the acquiring the flat display comprises:
    preparing the flat display on a flat glass substrate, wherein the flat display comprises a base film layer and pixels disposed on one surface of the base film layer, and the pixels are substantially equidistantly distributed on the base film layer; and
    separating the flat glass substrate from the flat display.

5. The method according to claim 4, wherein in the adhering the to be bent portion of the flat display to the elastic film,
    the elastic film is adhered to another surface of the base film layer where the pixels are not disposed on.

6. The method according to claim 4, wherein in the separating the flat glass substrate from the flat display,
    separating the flat glass substrate from the flat display by laser stripping.

7. The method according to claim 4, wherein the base film layer is made of polyimide.

8. The method according to claim 1, wherein the limited layer is made of at least one of acrylic, phosphoenolpyruvate, polyethylene naphthalate and polyimide.

9. The method according to claim 1, wherein in the performing the shrink treatment on the to be bent portion of the flat display, performing the shrink treatment on the flat display according to a preset curvature;
    in the bending the to be bent portion of the flat display after the shrink treatment, to form the curved display, bending the to be bent portion according to the preset curvature, pixels in the curved display are substantially equidistantly distributed.

* * * * *